United States Patent
Ishimabushi et al.

(10) Patent No.: US 9,281,364 B2
(45) Date of Patent: Mar. 8, 2016

(54) SEMICONDUCTOR DEVICE AND METHOD OF MANUFACTURING THE SAME

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Hisashi Ishimabushi, Toyota (JP); Tomohiro Mimura, Nisshin (JP); Narumasa Soejima, Seto (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 14/287,585

(22) Filed: May 27, 2014

(65) Prior Publication Data
US 2014/0353683 A1    Dec. 4, 2014

(30) Foreign Application Priority Data

Jun. 3, 2013 (JP) ................................ 2013-116937

(51) Int. Cl.
| | |
|---|---|
| H01L 21/84 | (2006.01) |
| H01L 21/336 | (2006.01) |
| H01L 29/16 | (2006.01) |
| H01L 21/04 | (2006.01) |
| H01L 29/66 | (2006.01) |
| H01L 29/872 | (2006.01) |
| H01L 29/861 | (2006.01) |
| H01L 29/06 | (2006.01) |
| H01L 29/786 | (2006.01) |
| H01L 29/78 | (2006.01) |

(52) U.S. Cl.
CPC .......... *H01L 29/1608* (2013.01); *H01L 21/046* (2013.01); *H01L 21/0465* (2013.01); *H01L 21/0495* (2013.01); *H01L 29/0619* (2013.01); *H01L 29/6606* (2013.01); *H01L 29/861* (2013.01); *H01L 29/872* (2013.01); *H01L 29/7802* (2013.01); *H01L 29/78642* (2013.01)

(58) Field of Classification Search
CPC ..................... H01L 29/78642; H01L 29/7802
USPC .......................... 438/99, 192, 212, 268–274
See application file for complete search history.

(56) References Cited

U.S. PATENT DOCUMENTS

| | | | | |
|---|---|---|---|---|
| 2007/0114599 A1* | 5/2007 | Hshieh | ................ | H01L 29/0634 257/330 |
| 2009/0146209 A1* | 6/2009 | Akiyama | ............ | H01L 29/0634 257/334 |
| 2012/0061682 A1* | 3/2012 | Yamamoto et al. | ............. | 257/77 |

FOREIGN PATENT DOCUMENTS

JP     A-2000-188399      7/2000

* cited by examiner

*Primary Examiner* — Karen Kusumakar
(74) *Attorney, Agent, or Firm* — Oliff PLC

(57) ABSTRACT

In a semiconductor substrate preparation step, a semiconductor substrate which is made of SiC and in which a first semiconductor region of a first conductivity type is formed is prepared. In a second semiconductor region forming step, a second semiconductor region is formed by implanting an impurity of a second conductivity type into a first semiconductor region through multiple ion implantation steps while varying implantation depths of the respective multiple ion implantation steps. In the second semiconductor region forming step, a dose amount of the impurity when an implantation energy of multiple ion implantation steps is the largest is smaller than a dose amount of impurity when the implantation energy is not the largest.

7 Claims, 6 Drawing Sheets

SEMICONDUCTOR DEVICE AND METHOD OF MANUFACTURING THE SAME

INCORPORATION BY REFERENCE

The disclosure of Japanese Patent Application No. 2013-116937 filed on Jun. 3, 2013 including the specification, drawings and abstract is incorporated herein by reference in its entirety.

BACKGROUND OF THE INVENTION

1. Field of the Invention

The technology disclosed in the present specification relates to a semiconductor device and a method of manufacturing the same.

2. Description of Related Art

Japanese Patent Application Publication No. 2000-188399 (JP 2000-188399 A) has disclosed a semiconductor device using SiC and a method of manufacturing the same. In this semiconductor device, a p-type base region, an n-type source region and a source electrode are formed on a semiconductor substrate thereof. The n-type source region is formed on the surface of the p-type base region. The top surface of the n-type source region is in contact with the source electrode. In a deep layer of the n-type source region (a region on the p-type base region side), nitrogen having a relatively light mass has been doped as an n-type impurity. On the other hand, in the surface layer of the n-type source region (a region opposite to the p-type base region), phosphorus having a relatively heavy mass has been doped as an n-type impurity. According to the JP 2000-188399 A, when performing a heat treatment to activate impurities, the diffusion velocity of phosphorus decreases due to the larger mass than nitrogen thereby making external diffusion more difficult than nitrogen. Thus, according to the structure of the JP 2000-188399 A, reduction of the concentration in the surface layer of the n-type source region can be prevented so that a rise in contact resistance with respect to the source electrode is prevented.

Although the JP 2000-188399 A has disclosed a technology of preventing external diffusion of impurities in the surface layer (i.e., a region in which the concentration of the impurity is relatively high) of the n-type source region, behavior of the impurity in the deep layer (i.e., a region in which the concentration of the impurity is relatively low) of the n-type source region has not been considered. More specifically, as shown in FIG. 2 of the JP 2000-188399 A, channeling of the impurity has occurred in the deep layer of the n-type source region in the semiconductor device of the JP 2000-1888399 A. The channeling of the impurity in a relatively low concentration region may affect the characteristic of the semiconductor device.

SUMMARY OF THE INVENTION

The present invention provides a semiconductor device for preventing channeling of the impurity in a relatively low concentration region and a method of manufacturing the same.

A method of manufacturing a semiconductor device according to the first aspect of the present invention includes a semiconductor substrate preparation step and a second semiconductor region forming step. In the semiconductor substrate preparation step, a semiconductor substrate which is made of Si and in which a first semiconductor region of a first conductivity type is formed on a surface of the semiconductor substrate is prepared. In the second semiconductor region forming step, a second semiconductor region is formed by implanting an impurity of a second conductivity type into the first semiconductor region through multiple ion implantation steps from the surface of the semiconductor substrate while varying implantation depths of the respective multiple ion implantation steps. In the second semiconductor region forming step, an implantation depth in a first ion implantation step of the multiple ion implantation steps is the deepest among the multiple ion implantation steps. In the second semiconductor region forming step, an implantation depth in a second ion implantation step of the multiple ion implantation steps is less deep than the implantation depth in the first ion implantation step. In the second semiconductor region forming step, a dose amount of the impurity in the first ion implantation step is smaller than a dose amount of the impurity in the second ion implantation step.

A method of manufacturing a semiconductor device according to the second aspect of the present invention includes: preparing a semiconductor substrate which is made of SiC and in which a first semiconductor region of a first conductivity type is formed on a surface of the semiconductor substrate; forming a second semiconductor region by implanting an impurity of a second conductivity type through multiple ion implantation steps from the surface of the semiconductor substrate into the first semiconductor region while varying implantation depths of the respective multiple ion implantation steps; and reducing a dose amount of the impurity in a first ion implantation step of the multiple ion implantation steps with respect to a dose amount of the impurity in a second ion implantation step of the multiple ion implantation steps. An implantation energy in the first ion implantation step is the largest among the multiple ion implantation steps. An implantation energy in the second ion implantation step is less than the implantation energy in the first ion implantation step.

If the ion implantation of the impurities from a surface of a semiconductor substrate is performed, the impurities penetrate in the depth direction of the semiconductor substrate and stop there. At this time, some of the impurities go through crystal atoms of the semiconductor substrate and penetrate into the semiconductor substrate in the depth direction so that so-called channeling occurs. The length of the channeling (hereinafter, referred to as channeling length) in the depth direction of the semiconductor substrate increases as the dose amount of the impurities at the time of ion implantation increases. According to the method of manufacturing the semiconductor device of the first and second aspects of the present invention, a second semiconductor region is formed by performing multiple-step ion-implantation to a surface of the semiconductor substrate while varying implantation depths of the multiple ion implantation steps. At this time, the dose amount of the impurity (a dose amount when the ion-implantation is performed to a deepest position) when the implantation energy is the largest is adjusted to be smaller than the dose amount of the impurity when the implantation energy is not the largest (a dose amount when the ion implantation is performed to a shallower position than the deepest position). Thus, a channeling length of the impurity implanted to the deepest position from the surface of the semiconductor substrate is shorter than a channeling length of the impurity implanted to the shallower position. According to this structure, the channeling length in the vicinity of the bottom face of the second semiconductor region can be decreased compared to a case in which the multiple-step ion-implantations are performed with a constant dose amount. In other words, this can prevent the channeling in the vicinity of the bottom face of the second semiconductor region, that is, a region whose impurity concentration is relatively low.

A semiconductor device according to the third aspect of the present invention includes a semiconductor substrate made of SiC. The semiconductor substrate includes a first semiconductor region of first conductivity type and a second semiconductor region of second conductivity type which is in contact with a top surface of the first semiconductor region. An impurity concentration of the second conductivity type in the second semiconductor region is reduced in a depth direction of the semiconductor substrate. In the depth direction of the semiconductor substrate, the length from a position in the second semiconductor region which corresponds to a predetermined impurity concentration of $1.0 \times 10^{16}$ to $1.0 \times 10^{17}$ cm$^{-3}$ to a position in the second semiconductor region which corresponds to an impurity concentration which is 1/10 of the predetermined impurity concentration is 60 nm or less. With this structure, the concentration gradient of the impurity in the vicinity of the bottom face of the second semiconductor region is relatively steep, thereby preventing reduction of breakdown voltage of the semiconductor device.

The detail of the technology disclosed in the present specification and its further improvements will be described in detail in embodiments for carrying out the invention.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Brief summaries of embodiments described below are described in sequence. In the meantime, technical factors described below are independent technical factors which exert their technical usability independently or by various combinations thereof.

In the semiconductor device of the present embodiment, a second semiconductor region may be arranged in a range facing the top surface of the semiconductor substrate. The semiconductor substrate may further contain a drift region and a gate electrode. The drift region is located below the first semiconductor region and may be separated from the second semiconductor region by the first semiconductor region. The gate electrode may be arranged in a gate trench and opposite to the first semiconductor region via insulating film in a range where the first semiconductor region separates the second semiconductor region and the drift region from each other. The gate trench extends to the drift region through the second semiconductor region and the first semiconductor region. With the above-described structure, if electric potential applied to the gate electrode exceeds a threshold potential, a channel is formed in the first semiconductor region in a range which is in contact with the insulating film (i.e., a first semiconductor region which is located between the second semiconductor region and the drift region). With the above-described structure, the channeling is prevented in the vicinity of the bottom face of the second semiconductor region, and as a result, the channeling length of the first semiconductor region can be prevented from being reduced due to the channeling. Thus, reduction of the gate threshold voltage and reduction of withstand voltage of the semiconductor device can be prevented.

Figure 1:
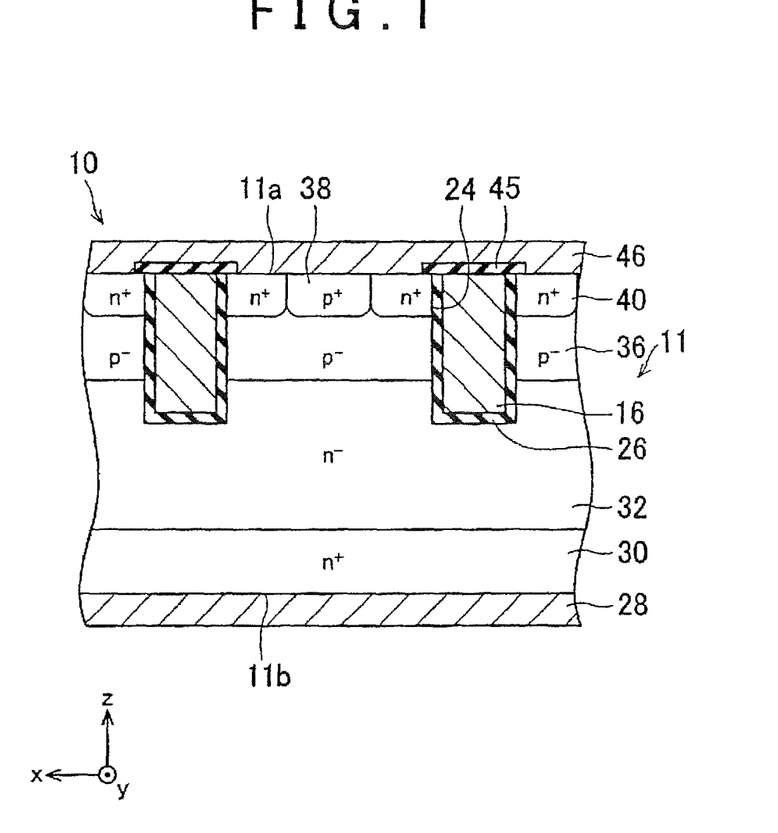
FIG. 1 is a longitudinal sectional view of a semiconductor device of the first embodiment.

A semiconductor device 10 of the present embodiment will be described. As shown in FIG. 1, the semiconductor device 10 contains a semiconductor substrate 11 made of SiC. In the semiconductor substrate 11, an element region and a non-element region surrounding the element region are formed. The element region will be described below and description of the non-element region, which has a conventionally known structure, is omitted.

The structure of the element region will be described with reference to FIG. 1. An n–type MOSFET is formed in the element region of the semiconductor substrate 11. That is, in the element region, specifically, the region facing the top surface of the semiconductor substrate 11, an n+type source region 40 and a p+type contact region 38 are formed. The contact region 38 is formed to contact the side face of the source region 40. In the meantime, the n+type source region 40 may be regarded as an example of "a second semiconductor region of a second conductivity type".

A p–type base region 36 is formed below the source region 40 and the contact region 38. The concentration of the impurity in the base region 36 is adjusted to be lower than the concentration of the impurity in the contact region 38. The base region 36 is in contact with the bottom face of the source region 40 and the bottom face of the contact region 38. Thus, the source region 40 is surrounded by the base region 36 and the contact region 38. In the meantime, the base region 36 may be regarded as an example of "a first semiconductor region of a first conductivity type".

Further, an n–type drift region 32 is formed below the base region 36. The drift region 32 is formed on the entire face of the semiconductor substrate 11. The drift region 32 is separated from the source region 40 and the contact region 38 by the base region 36. The concentration of the impurity in the drift region 32 is adjusted to be lower than the concentration of the impurity in the source region 40.

A gate trench 24 is formed in the semiconductor substrate 11. The gate trench 24 passes through the source region 40 and the base region 36 from the top surface of the semiconductor substrate 11 while a bottom end thereof extends up to the drift region 32. A gate electrode 16 is formed in the gate trench 24. The gate electrode 16 is formed so that a bottom end thereof is slightly deeper than the bottom face of the base region 36. Insulating film 26 is provided between the wall face of the gate trench 24 and the gate electrode 16 (i.e., sideway of and under the gate electrode 16). Thus, the gate electrode 16 is opposite to the base region 36 and the source region 40 via the insulating film 26. Cap insulating film 45 is formed on the top face of the gate electrode 16.

An n+type drain region 30 is formed in a range which faces the bottom face of the semiconductor substrate 11. The drain region 30 is formed on the entire face of the semiconductor substrate 11. The concentration of the impurity in the drain region 30 is adjusted to be higher than the concentration of the impurity in the drift region 32. The drain region 30 is in contact with the bottom face of the drift region 32. The drain region 30 is separated from the base region 36 by the drift region 32.

A drain electrode 28 is formed on the bottom face of the semiconductor substrate 11. The drain electrode 28 is formed on the entire face of the semiconductor substrate 11. The drain electrode 28 is ohmic-contact with the drain region 30. A source electrode 46 is formed on the top face of the semiconductor substrate 11. The source electrode 46 is formed within the element region. The source electrode 46 is ohmic-contact with the source region 40 and the contact region 38. The source electrode 46 is insulated from the gate electrode 16 by a cap insulating film 45.

Figure 2:
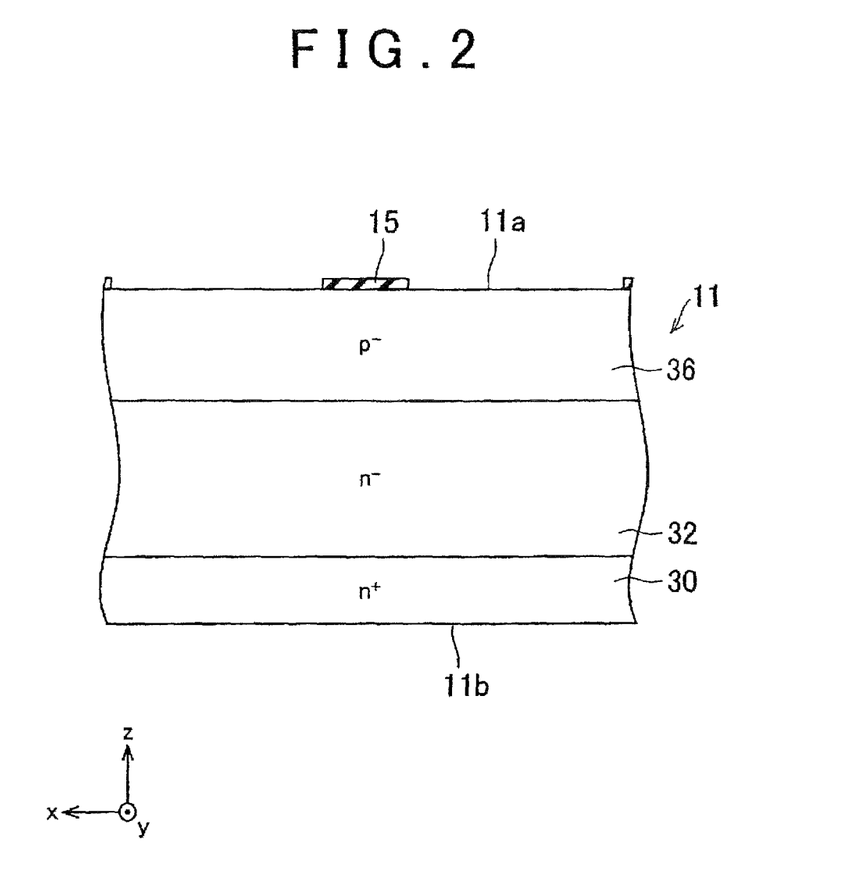
FIG. 2 shows a method of manufacturing the semiconductor device of the first embodiment.
Figure 3:
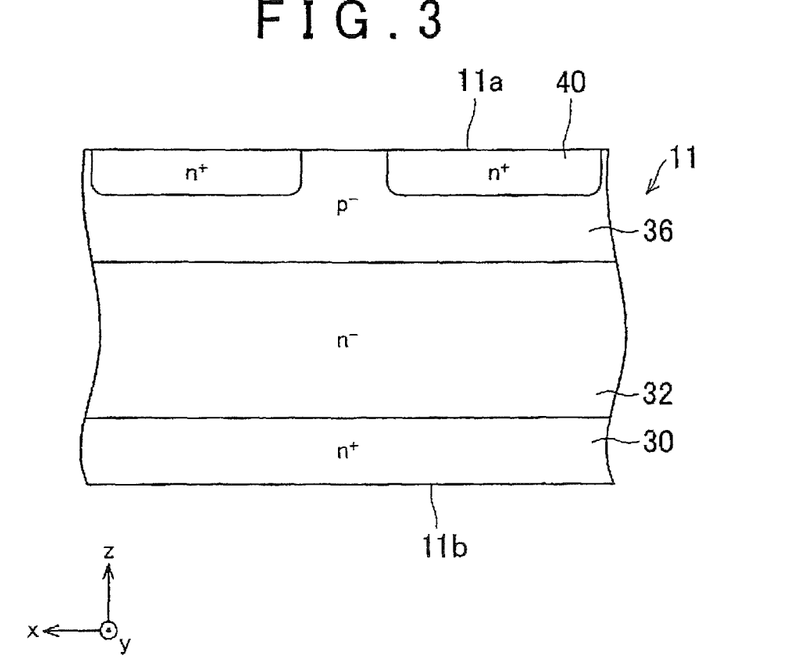
FIG. 3 shows a method of manufacturing the semiconductor device of the first embodiment.

Next, a method of manufacturing the semiconductor device 10 will be described with reference to FIGS. 1 to 3. Portions relating to the technology disclosed in the present specification will be described in detail and description of other portions, which have been conventionally known, is omitted. In the present embodiment, the semiconductor device 10 is manufactured by executing a semiconductor substrate preparation step, a second semiconductor region forming step, an upper side element forming step and an electrode forming step.

Hereinafter, the semiconductor substrate preparation step will be described. First, an n+type raw material wafer indicated with reference numeral 30 is prepared as shown in FIG. 2. The raw material wafer is a wafer made of single crystal SiC and serves as the drain region 30 when the semiconductor device 10 is completed. Next, the n-type drift region 32 is formed by epitaxial-growing the raw material wafer. When forming the drift region 32, nitrogen which is an n-type impurity is applied thereto at a predetermined concentration. Subsequently, the drift region 32 is epitaxial-grown to form the p+type base region 36. When forming the base region 36, boron which is a p-type impurity is applied thereto at a predetermined concentration. As a result, the semiconductor substrate 11 is formed. That is, the base region 36 is formed an a surface 11a of the semiconductor substrate 11.

The second semiconductor region forming step will be described below. Next, a mask 15 is formed on the surface 11a of the semiconductor substrate 11 and an ion implantation, in which nitrogen is implanted into the base region 36 from the surface 11a, is performed. The ion implantation is performed in the depth direction (−z-axis direction of FIG. 2) (hereinafter referred to as just "depth direction" also) of the semiconductor substrate 11. In the present embodiment, the ion implantations are performed four times while changing the implantation depth. After the ion implantation, anneal processing is performed under 1600 to 1800 [° C.] to activate the implanted nitrogen to form the n+type source region 40 as shown in FIG. 3. Forming step of the source region 40 will be described in detail below.

The upper side element forming step and the electrode forming step will be described below. Next to the second semiconductor region forming step, after the mask 15 is removed, the upper side element constituted of the contact region 38, the gate trench 24, the insulating film 26, the gate electrode 16, and the cap insulating film 45 is formed in the semiconductor substrate 11. Because the upper side element has an ordinary n-type MOSFET trench gate structure, a detailed description of the forming method thereof is omitted. Subsequently, the source electrode 46 which is ohmic-contact with the source region 40 and the contact region 38 is formed on the surface 11a of the semiconductor substrate 11. Likewise, the drain electrode 28 which is ohmic-contact with the drain region 30 is formed on a rear surface 11b of the semiconductor substrate 11. The source electrode 46 and the drain electrode 28 are formed by deposition or the like. The semiconductor device 10 shown in FIG. 1 is manufactured in the above-described steps.

Figure 4:
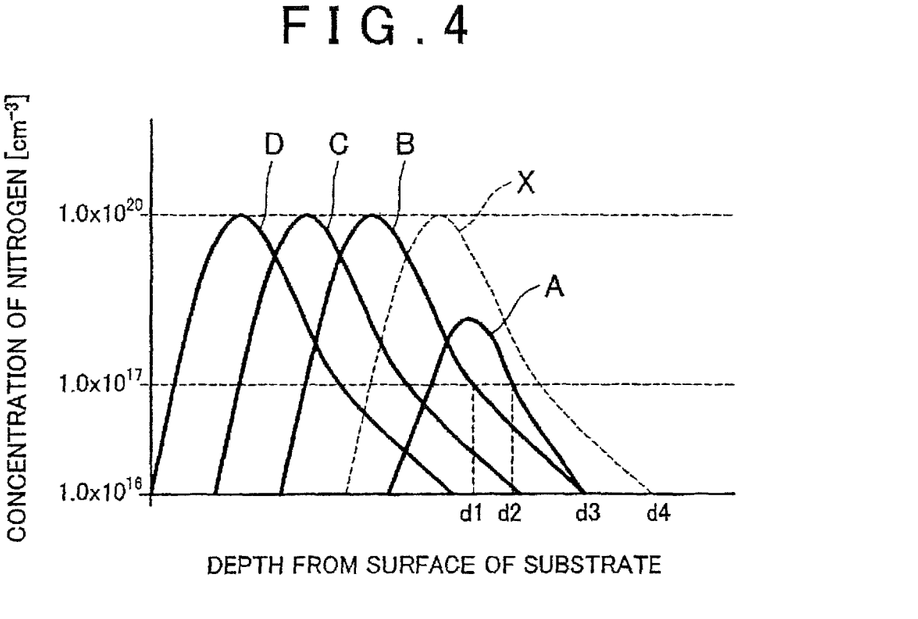
FIG. 4 shows a distribution of nitrogen concentration in a depth direction from the surface of a substrate upon ion implantation of multiple steps.

Generally, in case of the semiconductor substrate made of SiC, little nitrogen diffusion is generated at the time of anneal processing unlike a case of the semiconductor substrate made of Si. Thus, in the above-described second semiconductor region forming step, the source region 40 is formed by the ion implantations of multiple steps while varying the implantation depth. Here, the forming step of the source region 40 will be described in detail with reference to FIGS. 4, 5. FIG. 4 shows a relationship between the depth from the surface 11a of the semiconductor substrate 11 and the concentration of nitrogen after anneal processing when the ion implantation has been performed four times. A curve A indicates a distribution of nitrogen concentration due to the first ion implantation and curves B to D indicate a distribution of nitrogen concentration due to the second to fourth time. As regards the depth at the peak of the curves A to D, the curve A is the deepest followed by the curves B, C, and D in order. That is, for the ion implantation, the implantation energy of the first time is the largest and subsequently, it is executed with the implantation energy reduced gradually. The ion implantation of the second to fourth time is performed such that the peak value of nitrogen concentration after the anneal processing is about $1.0 \times 10^{20}$ [cm$^{-3}$]. On the other hand, the ion implantation of the first time is performed such that the peak value of the nitrogen concentration after the anneal processing is lower than the ion implantation of the second to fourth time. Because the peak value of the nitrogen concentration after the anneal processing depends on the dose amount of nitrogen upon ion implantation, FIG. 4 indicates that the dose amount of nitrogen at the time of ion implantation of the first time is smaller than the dose amount of nitrogen at the time of ion implantation of the second to fourth time. In other words, it is evident that the dose amount of nitrogen when the implantation energy of the ion implantation is the largest is smaller than the dose amount of nitrogen when the implantation energy is not the largest. In the meantime, a curve X designated with a dotted line indicates a distribution of nitrogen concentration at the time of ion implantation of the first time upon multiple-step ion implantation (constant dose amount) based on a related art. The ion implantation of the second to fourth time in the present embodiment is performed with the same implantation energy and the same dose amount as at the ion implantation of the second to fourth time of the related art. Thus, it can be said that upon the ion implantation of the present embodiment, the dose amount of nitrogen at the time of the ion implantation of the first time is smaller than the dose amount of nitrogen at the time of the ion implantation of the first time of the related art.

Next, channeling of nitrogen will be described. According to the distribution of the nitrogen concentration (i.e., curve B) by the ion implantation of the second time, it is evident that in a deeper region than the depth in which the nitrogen concentration reaches its peak (hereinafter, referred to as opposite-to-surface side region), the concentration gradient of nitrogen in a region in which the nitrogen concentration is $1.0 \times 10^{16}$ to $1.0 \times 10^{17}$ [cm$^{-3}$] (hereinafter also referred to as "low concentration region") is milder than the concentration gradient of nitrogen in a region in which the nitrogen concentration is $1.0 \times 10^{17}$ to $1.0 \times 10^{20}$ [cm$^{-3}$]. In other words, in the low concentration region, nitrogen has deeply penetrated in the depth direction of the semiconductor substrate 11. Phenomenon of nitrogen's deep penetration into the low concentration region in the opposite-to-surface side region upon the ion implantation of a single time is called channeling. The length of the channeling of nitrogen (hereinafter also referred to as just "channeling length") by the ion implantation of the second time is d3–d1 and the channeling length by the ion implantation of the first time is d3–d2. In the meantime, a region in which the nitrogen concentration of the present embodiment is $1.0 \times 10^{16}$ to $1.0 \times 10^{17}$ [cm$^{-3}$] is called low concentration region. This is because the range of the nitrogen concentration of the source region 40 which affects the characteristics (gate threshold voltage, withstand voltage, etc.) of the semiconductor device 10 is $1.0 \times 10^{16}$ to $1.0 \times 10^{17}$ [cm$^{-3}$]. Thus, the concentration range in which the channeling occurs is not restricted to $1.0 \times 10^{16}$ to $1.0 \times 10^{17}$ [cm$^{-3}$].

Figure 5:
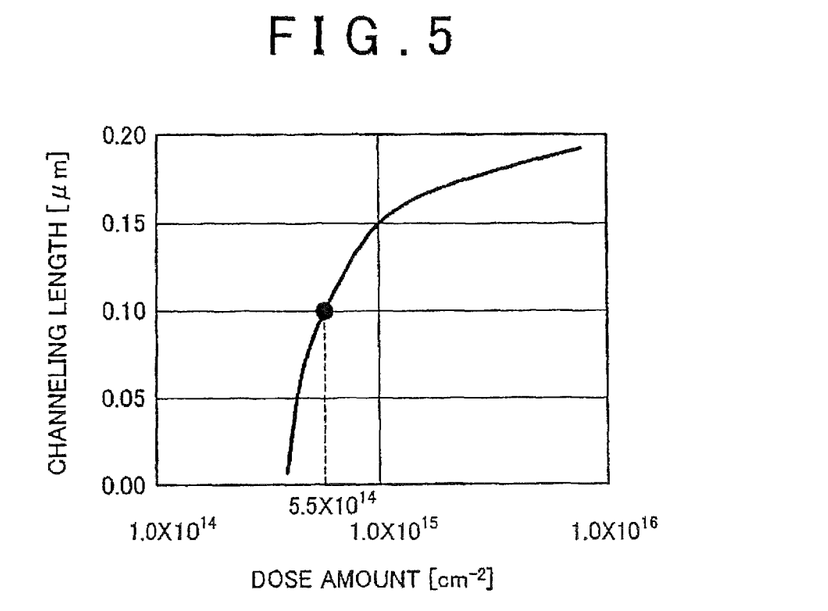
FIG. 5 shows a relationship between a dose amount and a channeling length of nitrogen.

FIG. 5 shows a relationship between the dose amount of nitrogen at the time of the ion implantation and the channeling length in the low concentration region. More specifically, this figure shows a channeling length calculated based on a numeric value obtained by a process simulation which calibrates a SIMS (secondary ion mass spectrometry) result at a high precision. According to FIG. 5, it is evident that the channeling length depends on the dose amount of nitrogen and as the dose amount of nitrogen increases, the channeling length increases. In the present embodiment, the dose amount of nitrogen at the time of ion implantation of the first time is adjusted to the smaller than the dose amount of nitrogen at the time of the ion implantation of the second to fourth time. Further, the dose amount of nitrogen at the time of the ion implantation of the second to fourth time is substantially equal. Thus, as shown in FIG. 4, the channeling length (d3–d2) by the ion implantation of the first time is shorter than the channeling length (d3–d1) by the ion implantation of the second to fourth time. Thus, the depth of the bottom face (position whose nitrogen concentration is $1.0 \times 10^{16}$ [cm$^{-3}$]) of the source region 40 formed by the ion implantations of four times is a position of depth d3. On the other hand, because the distribution of the nitrogen concentration of the curve X is substantially the same as the distribution of the nitrogen concentration of the curves B to D, the channeling length of the curve X is substantially the same as the channeling length of the curves B to D. Thus, a depth of the bottom face of the source region formed by the multi-step ion implantations based on the related art is a position of depth d4, which is deeper than the depth d3 of the bottom face of the source region 40 of the present embodiment.

According to the method of manufacturing the semiconductor device 10 of the present embodiment, the dose amount of nitrogen to be implanted into a deepest position from the surface 11a of the semiconductor substrate 11 is adjusted to be smaller than the dose amount of nitrogen to be implanted into a swallower position by using a knowledge that the channeling length depends on the dose amount of nitrogen. As a result, the channeling length in the vicinity of the bottom face of the source region 40 can be made shorter than the related art. That is, the channeling in the vicinity of the bottom face of the source region 40 (low concentration region) can be prevented. In other words, the source region 40 in which the concentration gradient of nitrogen in the low concentration region is steeper than the related art can be formed. As a result, reduction of the characteristic of the semiconductor device 10 due to the channeling in the low concentration region can be prevented.

Further, to prevent reduction of withstand voltage of the semiconductor device 10, the nitrogen concentration (strictly speaking, peak value of the distribution of the nitrogen concentration) of the source region 40 is demanded to be maintained at a predetermined value (in the present embodiment, $1.0 \times 10^{20}$ [cm$^{-3}$]). According to the related art, if the source region is formed such that the nitrogen concentration is, for example, $1.0 \times 10^{20}$ [cm$^{-3}$], the channeling length in the vicinity of the bottom face of the source region is as long as 0.15 to 0.18 [µm] in a range in which the nitrogen concentration is $1.0 \times 10^{16}$ to $1.0 \times 10^{17}$ [cm$^{-3}$]. Thus, the channeling may affect the characteristic of the semiconductor device in the related art. However, according to the method of manufacturing the semiconductor device 10 of the present embodiment, only the dose amount of nitrogen at the time of the ion implantation of the first time (i.e., implanting into the deepest position from the surface 11a of the semiconductor substrate 11) is reduced and the dose amount of nitrogen at the time of the ion implantation of the second to fourth time is kept substantially the same as conventionally. As a result, the channeling in the vicinity of the bottom face of the source region 40 can be prevented without reducing the nitrogen concentration in the source region 40. For example, by using the graph of FIG. 5, the channeling length in the vicinity of the bottom face of the source region 40 can be controlled to a desired value in a range in which the nitrogen concentration is $1.0 \times 10^{16}$ to $1.0 \times 10^{17}$ [cm$^{-3}$]. For example, if the channeling length in the vicinity of the bottom face of the source region 40 is desired to be 0.10 [µm], nitrogen of $5.5 \times 10^{14}$ [cm$^{-2}$] is implanted at the time of the ion implantation of the first time. By using the graph of FIG. 5, a dose amount of nitrogen necessary for securing a desired channeling length can be obtained without any experiment. In the meantime, no influence of the channeling due to the ion implantation of the second to fourth time is considered. However, the channeling length in the vicinity of the bottom face of the source region 40 can be controlled by adjusting the implantation energy of each ion implantation (i.e., by adjusting the implantation depth from the surface 11a of the semiconductor substrate 11).

Further, according to the method of manufacturing the semiconductor device 10 of the present embodiment, the depth of the bottom face of the source region 40 is reduced by a length of d4–d3. Thus, the channeling length (base region 36 which is located between the source region 40 and the drift region 32 and in a range in contact with the insulating film 26) can be increased compared to the related art. Thus, reduction of the gate threshold voltage and reduction of withstand voltage of the semiconductor device 10 can be prevented. Further, reduction of the characteristic of the semiconductor device 10 due to hot carrier can be prevented.

Figure 6:
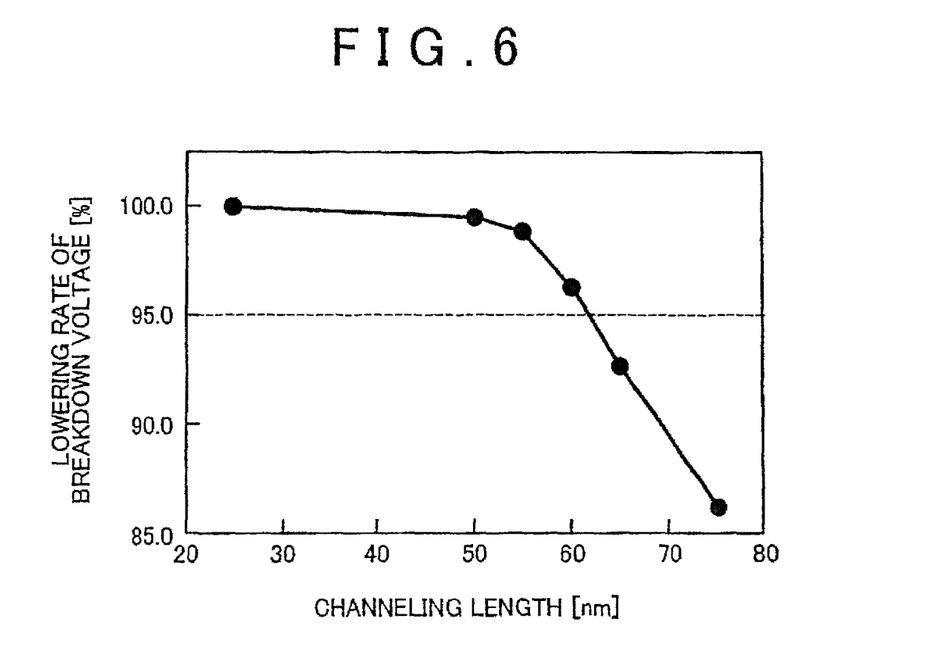
FIG. 6 shows a relationship between the length of channeling and a lowering rate of breakdown voltage when the concentration of nitrogen in a low concentration region is reduced to 1/10.

As described above, in the semiconductor device 10 of the present embodiment, the reduction of the characteristic of the semiconductor device 10 is prevented by making the concentration gradient of nitrogen in, the vicinity of the bottom face of the source region 40 steeper than the related art. As evident from FIG. 4, the concentration of nitrogen in the vicinity of the bottom face of the source region 40 decreases in the depth direction of the semiconductor substrate 11. At this time, the length of the channeling in the depth direction when the concentration of nitrogen is reduced to 1/10 in the low concentration region (a region in which the concentration of nitrogen is $1.0 \times 10^{16}$ to $1.0 \times 10^{17}$ [cm$^{-3}$]) is desired to be approximately 60 [nm] or less. The reason will be described with reference to FIG. 6. FIG. 6 shows a relationship between the channeling length in the depth direction when the concentration of nitrogen in the low concentration region is reduced to $\frac{1}{10}$ and the lowering rate of breakdown voltage. In FIG. 6, a voltage when a leak current of $1.0 \times 10^{-9}$ [A] flows to the semiconductor device 10 is defined as breakdown voltage of the semiconductor device 10. Further, the breakdown voltage when the channeling length in the depth direction is 25 [mm] when the concentration of nitrogen in the low concentration region is reduced to $\frac{1}{10}$ is defined as reference voltage of the breakdown voltage. That is, FIG. 6 shows the channeling length and the lowering rate of the breakdown voltage from the reference voltage with the breakdown voltage, when the channeling length in the depth direction when the concentration of nitrogen is reduced to $\frac{1}{10}$ is 25 [nm], assumed to be 100 [%]. According to FIG. 6, it is evident that as the channeling length in the depth direction when the concentration of nitrogen in the low concentration region is reduced to $\frac{1}{10}$ decreases, the lowering rate of the breakdown voltage from the reference voltage decreases. In other words, as the concentration gradient of nitrogen in the low concentration region makes steeper (i.e., as the restriction of the channeling is enhanced), the reduction of the withstand voltage of the semiconductor device 10 can be prevented more. Here, if the range of deviation from the reference voltage is 5 [%] or less, the characteristic of the semiconductor device 10 is not so much affected. According to FIG. 6, the length in the depth direction when the breakdown voltage is 95 [%] of the reference voltage is more than 60 [nm]. Thus, if the channeling length in the depth direction when the concentration of nitrogen in the low concentration region is reduced to $\frac{1}{10}$ is approximately 60 [nm] or less, it may be considered that the reduction of the characteristic of the semiconductor device 10 due to the channeling in the low concentration region is prevented.

Further, in the present embodiment, the drift region 32 and the base region 36 are formed by epitaxial-growing a wafer made of single crystal SiC. Generally, it has been known that the epitaxial layer of SiC is likely to vary in terms of concentration compared to the epitaxial layer of Si. For example, the concentration of boron in the base region 36 may sometimes vary by approximately 10%. If the concentration of the base region 36 varies, a junction depth of PN-junction between the base region 36 and the source region 40 varies depending on the position of the base region 36 due to the channeling of nitrogen ion-implanted into the base region 36. As a result, the channeling length may vary so that the gate threshold voltage and the ON resistance of the semiconductor device 10 may vary. In the semiconductor device 10 of the present embodiment, the channeling of nitrogen in the vicinity of the bottom face of the source region 40 can be prevented. Thus, even when implanting ion into the base region 36 which is an epitaxial layer of SiC whose concentration is likely to vary, the channeling is prevented. As a result, a variation in the junction depth can be prevented to prevent a variation in the channeling length. Consequently, variations in the gate threshold voltage and the ON resistance of the semiconductor device 10 can be prevented.

Next, a semiconductor device and a method of manufacturing the same according to the second embodiment will be described. Only different points from the first embodiment will be described below and detailed description of the same component and manufacturing method as the first embodiment is omitted.

Figure 7:
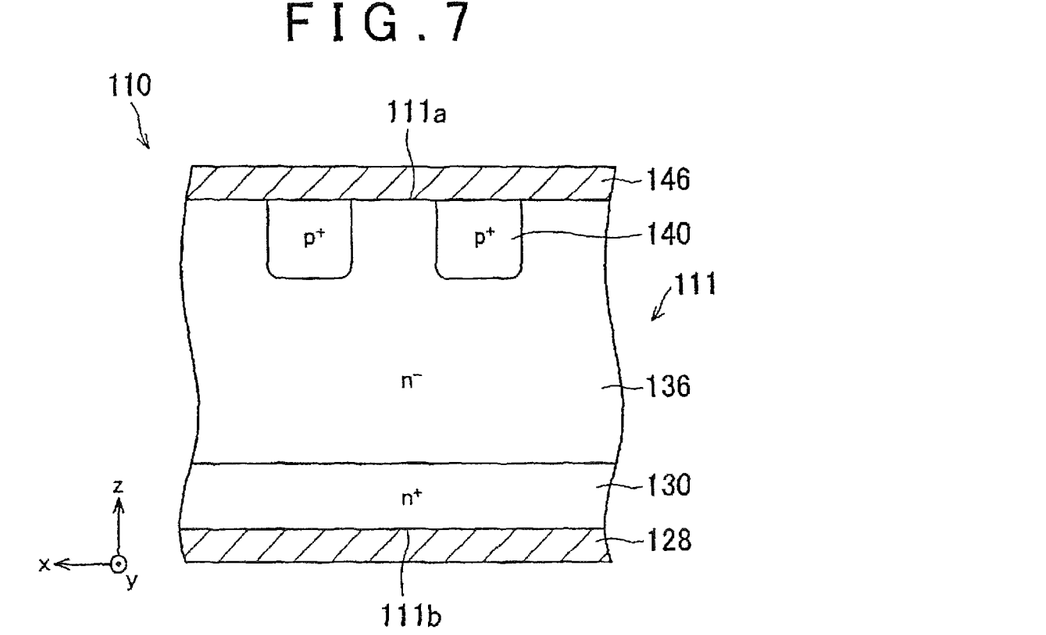
FIG. 7 shows a longitudinal sectional view of a semiconductor device of the second embodiment.

As shown in FIG. 7, a semiconductor device 110 contains a semiconductor substrate 111 formed of SiC. A junction barrier Schottky diode (JBS diode) is formed in the element region of the semiconductor substrate 111. That is, p+type anode region 140 and n−type drift region 136 are formed in a range facing the top surface of the semiconductor substrate 111 of the element region. The drift region 136 is formed such that it is in contact with the side face and the bottom face of the anode region 140 and surrounds the anode region 140. The n+type cathode region 130 is formed under the drift region 136 such that it is in contact with the drift region 136. The cathode region 130 is separated from the anode region 140 by the drift region 136. The concentration of the impurity in the cathode region 130 is adjusted to be higher than the concentration of the impurity in the drift region 136. An anode electrode 146 is formed on a surface 111a of the semiconductor substrate 111 and a cathode electrode 128 is formed on a rear surface 111b thereof. The anode region 140 and the drift region 136 are ohmic-contact with the anode electrode 146 and the cathode region 130 is ohmic-contact with the cathode electrode 128. In the meantime, the drift region 136 may be regarded as an example of the "the first semiconductor region of the first conductivity type". The anode region 140 may be regarded as an example of the "second semiconductor region of the second conductivity type".

Figure 8:
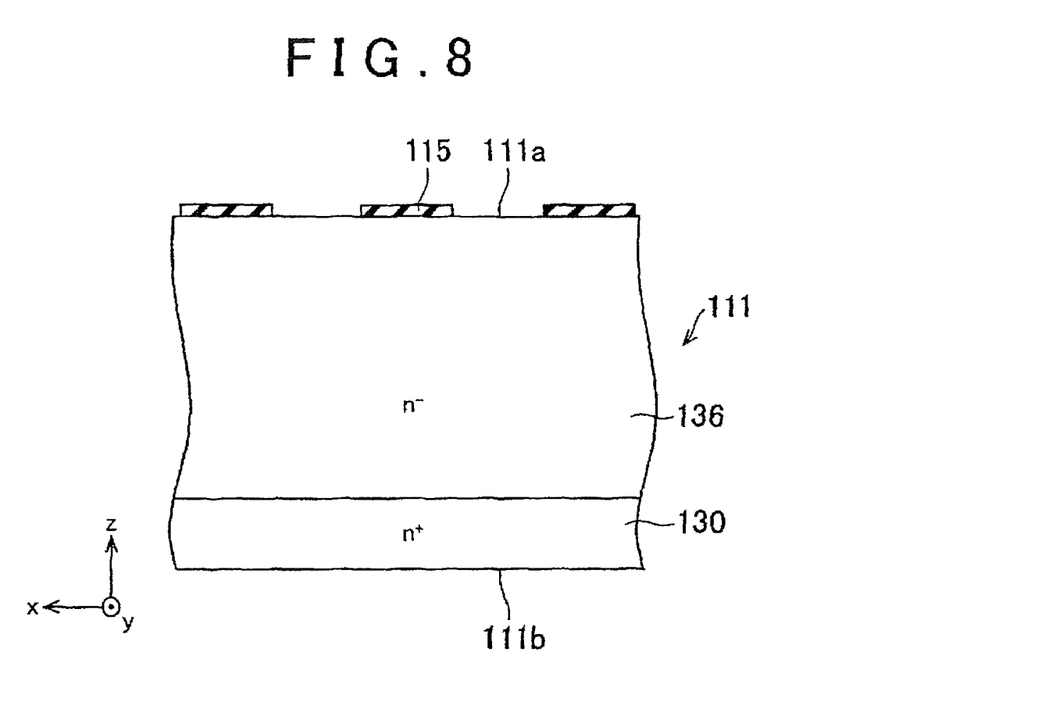
FIG. 8 shows a method of manufacturing a semiconductor device of the second embodiment.
Figure 9:
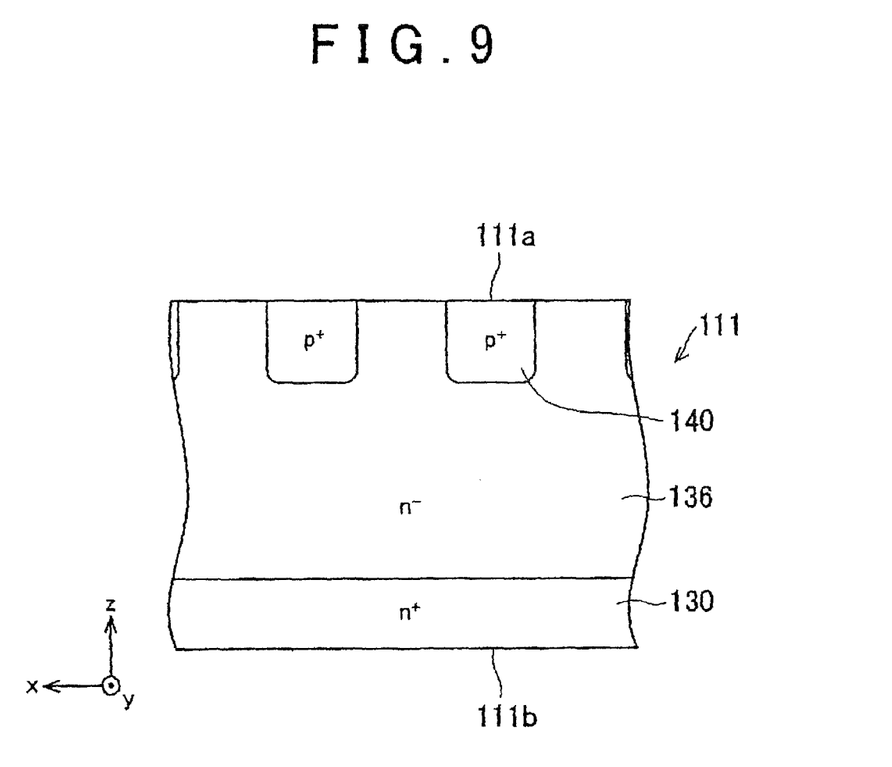
FIG. 9 shows a method of manufacturing the semiconductor device of the second embodiment.

Next, a method of manufacturing the semiconductor device 110 will be described with reference to FIGS. 8 and 9. In the present embodiment, the semiconductor device 110 is manufactured by executing a semiconductor substrate preparation step, a second semiconductor region forming step, and an electrode forming step.

Hereinafter, the semiconductor substrate preparation step will be described. First, n+type raw material wafer (cathode region when the semiconductor device 110 is completed) indicated with reference numeral 130 as shown in FIG. 8 is epitaxial-grown to form the n−type drift region 136. As the raw material wafer, single crystal SiC is used. Upon formation of the drift region 136, nitrogen which is an n−type impurity is charged at a predetermined concentration. As a result, the semiconductor substrate 111 is formed. That is, the drift region 136 is formed on the surface 111a of the semiconductor substrate 111.

The second semiconductor region forming step will be described below. Next to the semiconductor substrate preparation step, a mask 115 is formed on the surface 111a of the semiconductor substrate 111 and boron which is an impurity is ion-implanted into the drift region 136 from the surface 111a. Because the ion implantation is performed using the same method as the method of manufacturing the semiconductor device 10 of the first embodiment, detailed description thereof is omitted. After the ion implantation, anneal processing is performed to activate the boron to form the p+type anode region 140 as shown in FIG. 9.

The electrode forming step will be described below. Next to the second semiconductor region forming step, after the mask 115 is removed, the anode electrode 146 which is ohmic-contact with the anode region 140 and the drift region 136 is formed on the surface 111a of the semiconductor substrate 111. The cathode electrode 128 which is ohmic-contact with the cathode region 130 is formed on the rear surface 111b of the semiconductor substrate 111. The semiconductor device 110 as shown in FIG. 7 is manufactured through the above-described steps.

The semiconductor device 110 manufactured according to the above-described manufacturing method can exert the same effect as the semiconductor device 10 of the first embodiment. Further, because channeling of boron can be suppressed, the anode region 140 can be formed with a high accuracy. Thus, compared to a case of forming the anode region by multiple-step ion implantation of the related art, the amount of current of the JBS diode can be increased thereby improving the ON-state current.

Although the embodiments of the technology disclosed in the present specification have been described in detail above, these are only exemplifications. The semiconductor device and the method of manufacturing the same disclosed in the present specification include various modifications and alterations of the above-described embodiments.

Although in the above-described embodiments, for example, the base region 36 and the drift region 136 are formed by epitaxial growth of raw material wafer, the present invention is not restricted to this but they may be formed by ion implantation, for example. Further, the ion to be implanted in the second semiconductor region forming step is not restricted to nitrogen or boron. In case of forming an n-type semiconductor region, for example, phosphorus or arsenic may be implanted and in case of forming a p-type semiconductor region, for example, aluminum may be implanted. Further, the above-described manufacturing method is not restricted to manufacturing of MOSFET or JBS diode, but may be applied to manufacturing of all types of the semiconductor devices including the IGBT. Although in the above-described embodiments, the dose amount of nitrogen at the time of the ion implantation of the second to fourth time is substantially the same, the present invention is not restricted to this example. For example, it is permissible to reduce the dose amount of nitrogen at the time of the second ion implantation to decrease the channeling length of nitrogen to be formed by the second ion implantation.

What is claimed is:

1. A method of manufacturing a semiconductor device comprising:
   a semiconductor substrate preparation step of preparing a semiconductor substrate which is made of SiC and in which a first semiconductor region of a first conductivity type is formed on a surface of the semiconductor substrate; and
   a second semiconductor region forming step of forming a second semiconductor region by implanting an impurity of a second conductivity type into the first semiconductor region through multiple ion implantation steps from the surface of the semiconductor substrate while varying implantation depths of the respective multiple ion implantation steps, wherein
   in the second semiconductor region forming step, an implantation depth in a first ion implantation step of the multiple ion implantation steps is the deepest among the multiple ion implantation steps,
   in the second semiconductor region forming step, an implantation depth in a second ion implantation step of the multiple ion implantation steps is less deep than the implantation depth in the first ion implantation step,
   in the second semiconductor region forming step, an implantation depth in a third ion implantation step of the multiple ion implantation steps is less deep than the implantation depth in the second ion implantation step,
   in the second semiconductor region forming step, a dose amount of the impurity in the first ion implantation step is smaller than a dose amount of the impurity in the second ion implantation step, and
   in the second semiconductor region forming step, a dose amount of the impurity in the third ion implantation step is nearly equal to the dose amount of the impurity in the second ion implantation step.

2. The method of manufacturing the semiconductor device according to claim 1, wherein
   in the second semiconductor region forming step, an implantation energy in the first ion implantation step is the largest among the multiple ion implantation steps,
   in the second semiconductor region forming step, an implantation energy in the third ion implantation step of the multiple ion implantation steps is smaller than the implantation energy in the first ion implantation step, and
   in the second semiconductor region forming step, the dose amount of the impurity in the first ion implantation step is smaller than a dose amount of the impurity in the third ion implantation step.

3. The method of manufacturing the semiconductor device according to claim 1, wherein
   the dose amount of the impurity in the first ion implantation step is the smallest among the multiple ion implantation steps.

4. A method of manufacturing a semiconductor device comprising:
   preparing a semiconductor substrate which is made of SiC and in which a first semiconductor region of a first conductivity type is formed on a surface of the semiconductor substrate;
   forming a second semiconductor region by implanting an impurity of a second conductivity type through multiple ion implantation steps from the surface of the semiconductor substrate into the first semiconductor region while varying implantation depths of the respective multiple ion implantation steps; and
   reducing a dose amount of the impurity in a first ion implantation step of the multiple ion implantation steps with respect to a dose amount of the impurity in a second ion implantation step and with respect to a dose amount of the impurity in a third ion implantation step, of the multiple ion implantation steps, the dose amount of the impurity in the third ion implantation step being nearly equal to the dose amount of the impurity in the second ion implantation step, wherein
   an implantation energy in the first ion implantation step is the largest among the multiple ion implantation steps,
   an implantation energy in the second ion implantation step is less than the implantation energy in the first ion implantation step, and
   an implantation energy in the third ion implantation step is less than the implantation energy in the second ion implantation step.

5. The method of manufacturing the semiconductor device according to claim 4, wherein
   the dose amount of the impurity in the first ion implantation step is the smallest among the multiple ion implantation steps.

6. A semiconductor device comprising:
   a semiconductor substrate made of SiC and including a first semiconductor region of a first conductivity type and a second semiconductor region of a second conductivity type which is in contact with a top surface of the first semiconductor region, wherein
   an impurity concentration of the second conductivity type in the second semiconductor region is reduced in a depth direction of the semiconductor substrate, and
   in the depth direction of the semiconductor substrate, a length from a position in the second semiconductor region which corresponds to a predetermined impurity concentration of $1.0 \times 10^{16}$ to $1.0 \times 10^{17}$ cm$^{-3}$ to a position in the second semiconductor region which corresponds to an impurity concentration which is $\frac{1}{10}$ of the predetermined impurity concentration is 60 nm or less.

7. The semiconductor device according to claim 6, wherein
the second semiconductor region is arranged in a range facing the top surface of the semiconductor substrate,
the semiconductor substrate includes a drift region and a gate electrode,
the drift region is of the second conductivity type and located below the first semiconductor region while separated from the second semiconductor region by the first semiconductor region,
the gate electrode is arranged in a gate trench and is opposite to the first semiconductor region via insulating film in a range where the first semiconductor region separates the second semiconductor region and the drift region from each other, and
the gate trench extends to the drift region through the second semiconductor region and the first semiconductor region.

* * * * *